(12) United States Patent  
Javorka et al.

(10) Patent No.: US 9,224,655 B2
(45) Date of Patent: Dec. 29, 2015

(54) METHODS OF REMOVING GATE CAP LAYERS IN CMOS APPLICATIONS

(71) Applicant: GLOBALFOUNDRIES Inc., Grand Cayman (KY)

(72) Inventors: Peter Javorka, Radeburg (DE); Ralf Richter, Dresden (DE); Stefan Flachowsky, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 146 days.

(21) Appl. No.: 13/792,540

(22) Filed: Mar. 11, 2013

(65) Prior Publication Data

US 2014/0256135 A1    Sep. 11, 2014

(51) Int. Cl.
*H01L 21/311* (2006.01)
*H01L 21/8238* (2006.01)
*H01L 29/66* (2006.01)

(52) U.S. Cl.
CPC  *H01L 21/823807* (2013.01); *H01L 21/823814* (2013.01); *H01L 21/823828* (2013.01); *H01L 21/823864* (2013.01); *H01L 29/6653* (2013.01); *H01L 29/66545* (2013.01)

(58) Field of Classification Search
None
See application file for complete search history.

(56) References Cited

U.S. PATENT DOCUMENTS

| 5,504,039 | A | 4/1996 | Grivna |
| 5,723,879 | A | 3/1998 | Cho et al. |
| 6,261,887 | B1 | 7/2001 | Rodder |
| 6,388,294 | B1 | 5/2002 | Radens et al. |
| 6,804,010 | B1 * | 10/2004 | Stirniman ............ 356/507 |
| 6,960,523 | B2 | 11/2005 | Maldei et al. |
| 7,138,308 | B2 | 11/2006 | Cheng et al. |
| 7,265,007 | B2 | 9/2007 | Harter et al. |
| 7,615,807 | B2 | 11/2009 | Harter et al. |
| 7,616,077 | B1 * | 11/2009 | Wittwer et al. ............ 333/186 |
| 7,696,036 | B2 | 4/2010 | Bu et al. |
| 7,700,425 | B2 | 4/2010 | Wagner et al. |
| 8,035,173 | B2 | 10/2011 | Bu et al. |
| 2010/0047985 | A1 * | 2/2010 | Dakshina Murthy et al. 438/303 |
| 2012/0313187 | A1 | 12/2012 | Baars et al. |

OTHER PUBLICATIONS

Translation of Taiwanese Office Action Dated Aug. 13, 2015 for TW Application No. 102144344, filed on Dec. 4, 2013.

* cited by examiner

*Primary Examiner* — Binh X Tran
*Assistant Examiner* — David Cathey, Jr.
(74) *Attorney, Agent, or Firm* — Amerson Law Firm, PLLC (57) ABSTRACT

One illustrative method disclosed herein includes the steps of forming a masking layer that covers a P-type transistor and exposes at least a gate cap layer of an N-type transistor, performing a first etching process through the masking layer to remove a portion of the gate cap of the N-type transistor so as to thereby define a reduced thickness gate cap layer for the N-type transistor, removing the masking layer, and performing a common second etching process on the P-type transistor and the N-type transistor that removes a gate cap layer of the P-type transistor and the reduced thickness gate cap of the N-type transistor.

20 Claims, 5 Drawing Sheets

METHODS OF REMOVING GATE CAP LAYERS IN CMOS APPLICATIONS

BACKGROUND OF THE INVENTION

1. Field of the Invention

Generally, the present disclosure relates to the manufacture of sophisticated semiconductor devices, and, more specifically, to various methods of removing gate cap layers in integrated circuit products that employ CMOS technology.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET (whether an NFET or a PFET) is a device that typically includes a source region, a drain region, a channel region that is positioned between the source region and the drain region, and a gate electrode positioned above the channel region. A gate insulation layer is positioned between the gate electrode and the channel region that will be formed in the substrate. Electrical contacts are made to the source and drain regions, and current flow through the FET is controlled by controlling the voltage applied to the gate electrode. If the voltage applied to the gate electrode exceeds the threshold voltage of the transistor, then there is no current flow through the device (ignoring undesirable leakage currents, which are relatively small). However, when the voltage applied to the gate electrode exceeds the threshold voltage of the transistor, the channel region becomes conductive, and electrical current is permitted to flow between the source region and the drain region through the conductive channel region. Traditionally, FETs have been substantially planar devices, but similar principles of operation apply to more three-dimensional FET structures, devices that are typically referred to as FinFETs.

Figure 1A:
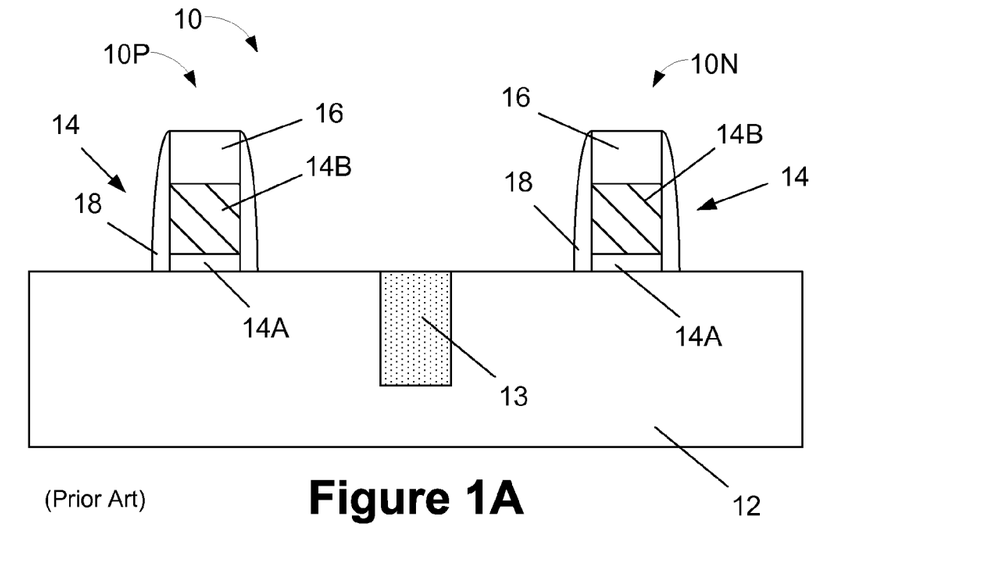
FIGS. 1A-1D depict one illustrative prior art process flow for removing gate cap layers in integrated circuit products that employ CMOS technology.

Many integrated circuit products are formed using both NFET and PFET devices, i.e., the products are manufactured using so-called CMOS (Complementary Metal Oxide Semiconductor) technology. FIGS. 1A-1D depict one illustrative prior art process flow for forming a semiconductor product or device 10 that includes an illustrative PFET transistor 10P and an illustrative NFET transistor 10N. As shown in FIG. 1A, the process begins with the formation of illustrative gate structures 14 for the PFET transistor 10P and the NFET transistor 10N in and above regions of the substrate 12 that are separated by an illustrative shallow trench isolation structure 13. The gate structures 14 generally include a gate insulation layer 14A and one or more conductive gate electrode layers 14B. A gate cap layer 16, made of a material such as silicon nitride, is formed above the gate structures 14. Also depicted in FIG. 1A is an illustrative sidewall spacer 18, made of a material such as silicon nitride. The gate structures 14 depicted herein are intended to be schematic and representative in nature, as the materials of construction used in the gate structures 14 may be different for the PFET transistor 10P as compared to the NFET transistor 10N, e.g., the PFET transistor 10P may have multiple layers of conductive metal, etc. The gate insulation layer 14A may be comprised of a variety of materials, such as silicon dioxide, silicon oxynitride, a high-k (k value greater than 7) insulating material, etc. The gate electrode layer 14B may be comprised of one or more layers of conductive materials, such as polysilicon, amorphous silicon, a metal, etc. The structure depicted in FIG. 1A may be formed by performing a variety of known techniques. For example, the layers of material that make up the gate insulation layer 14A, the gate electrode layer 14B and the gate cap layer 16 may be blanket-deposited above the substrate 12 and, thereafter, one or more etching processes are performed through a patterned mask layer (not shown) to define the basic gate structures 14 and gate cap layers 16 depicted in FIG. 1A. The spacers 18 may be formed by performing a conformal deposition process to deposit a layer of spacer material across the device and thereafter performing an anisotropic etching process. In general, the spacers 18 and the gate cap layer 16 act to protect the gate structures 14 of the devices 10P, 10N as processing operations continue. Importantly, at this point in the process flow, the gate cap layers 16 on both the PFET device 10P and the NFET device 10N have the same approximate thickness, e.g., about 40-50 nm, depending upon the particular application.

Figure 1B:
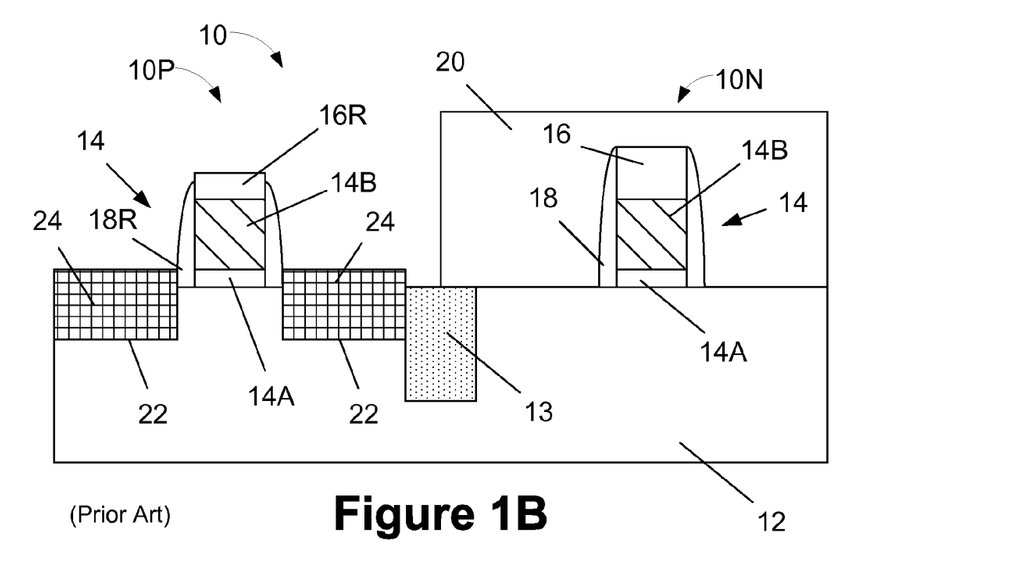

FIG. 1B depicts the device 10 after several process operations have been performed. Various well-known process operations that are performed to implant various dopant materials for the source/drain regions of the devices 10P, 10N, such as masking and ion implantation processes, will not be depicted or described as they are not particularly germane to the problems with the prior art manufacturing techniques described herein or the solutions discussed herein for such problems. At the point of fabrication depicted in FIG. 1B, one or more ion implantation processes would have been performed on the NFET transistor 10N to form various doped regions (not shown) in the substrate 12. Next, a schematically depicted masking layer 20, such as a photoresist mask or a hard mask material (like silicon nitride), is formed so as to cover the NFET transistor 10N and expose the PFET transistor 10P for further processing. Then, one or more etching processes are performed through the masking layer 20 to define cavities 22 in areas of the substrate 12 where source/drain regions for the PFET transistor 10P will ultimately be formed. The depth and shape of the cavities 22 may vary depending upon the particular application. In one example, the cavities 22 may be formed by performing an initial dry anisotropic etching process and, thereafter, performing a wet etching process. FIG. 1B depicts the device 10 after an epitaxial deposition process is performed to form epitaxial silicon/germanium (SiGe) regions 24 in the cavities 22. In the depicted example, the SiGe regions 24 have an overfill portion that extends above the surface of the substrate 12. The SiGe regions 24 may be formed by performing well-known epitaxial deposition processes.

Importantly, during the process of forming the cavities 22 and the SiGe regions 24, some of the gate cap layer 16 and the spacers 18 on the PFET device 10P are consumed, while the NFET device 10N is protected by the masking layer 20 during such process operations. The consumption of these structures is reflected by the use of the designation 16R for the recessed gate cap layer and the designation 18R for the recessed spacers on the PFET device 10P. The amount of consumption of the original gate cap layer 16 on the PFET device 10 during these process operations may vary depending upon the particular application and the precise process flow. In some cases, the recessed gate cap layer 16R may be approximately one-half of the initial thickness of the original gate cap layer 16. The recessed spacers 18R have also been reduced in thickness and overall height during these process operations, i.e., note the pull-down of the spacers 18R relative to the upper surface of the recessed gate cap layer 16R.

Figure 1C:
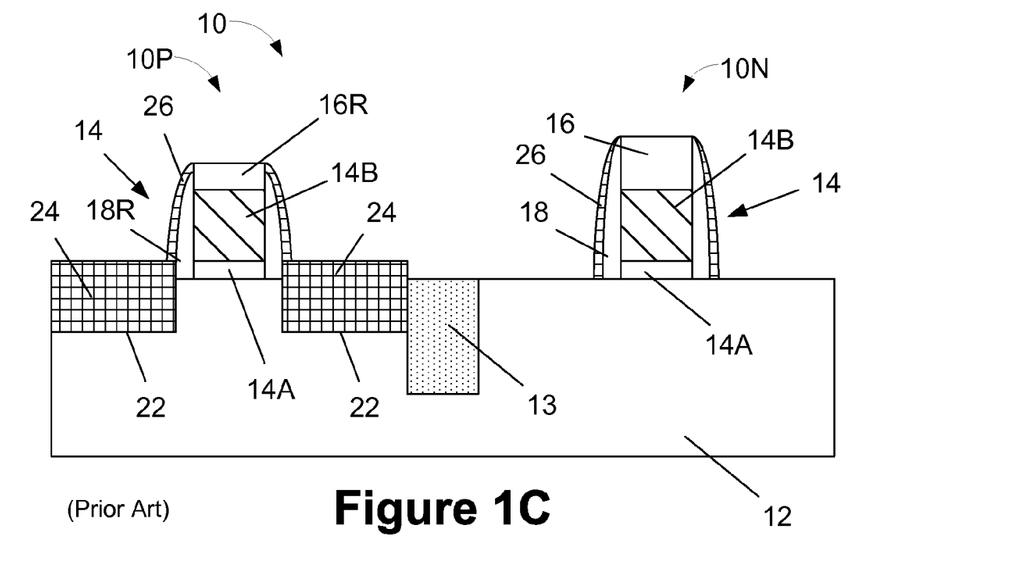

FIG. 1C depicts the device 10 after several process operations have been performed. First, the masking layer 20 was removed. Thereafter, sacrificial sidewall spacers 26 were formed adjacent the spacers 18R, 18. The sacrificial sidewall spacers 26 may be formed by depositing a layer of spacer material, e.g., silicon dioxide, and thereafter performing an anisotropic etching process. Eventually, the gate cap layers 16R, 16 will be removed to expose the gate electrodes 14B so that a metal silicide region may be formed on the gate electrodes 14B. The purpose of the sacrificial sidewall spacers 26 is to protect the relatively thin sidewall spacers 18R, 18 during the gate cap removal process, since the sidewall spacers 18R, 18 are typically made of the same material as that of the gate cap layers 16R, 16, e.g., silicon nitride.

Figure 1D:
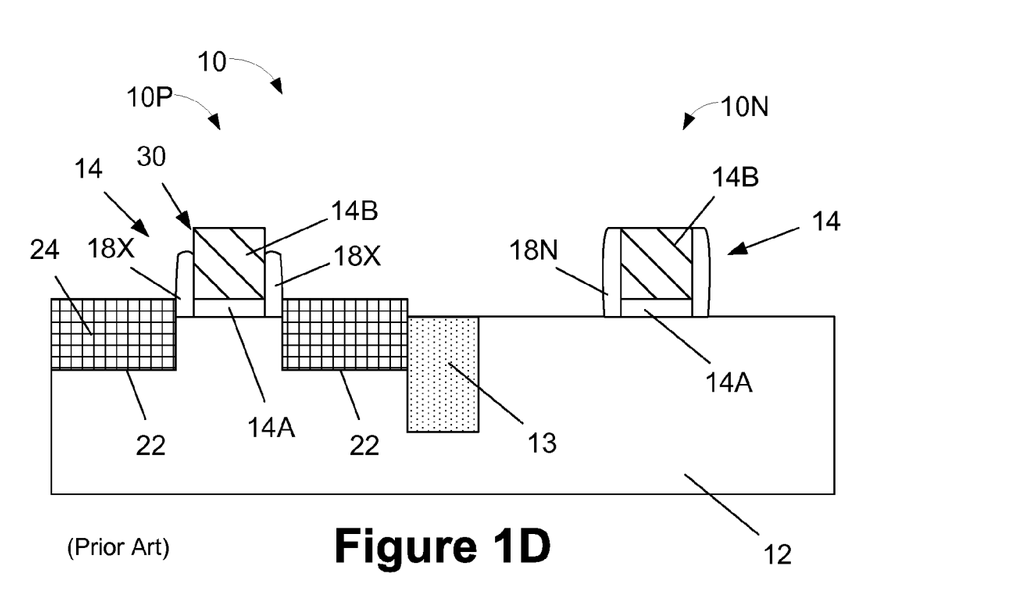

FIG. 1D depicts the device 10 after several process operations have been performed. First, a gate cap etching process was performed to remove the gate cap layers 16R, 16 and expose the underlying gate electrodes 14B for further processing. During this gate cap etching process, the sacrificial sidewall spacers 26 protect the sidewall spacers 18R, 18. Thereafter, another etching process was performed to remove the sacrificial sidewall spacers 26. These process operations result in the structure depicted in FIG. 1D. The gate cap etching process must be performed for a sufficient duration to insure that the thicker gate cap layer 16 on the NFET device 10N is completely removed. Importantly, due to the reduced thickness of the recessed gate cap layer 16R on the PFET device, the gate cap etching process consumes even more of the recessed spacers 18R on the PFET device. The additional consumption of the recessed spacers 18R is reflected by the use of the designation 18X for the spacers on the PFET device 10P. The spacers 18 on the NFET device 10N are also subject to some attack during the gate cap etching process. The size reduction of the recessed spacers 18 on the NFET device 10N is reflected by the use of the designation 18N. However, due to the presence of the thicker gate cap layer 16 on the NFET device 10N, the amount of the spacer material consumed on the NFET device 10N is much less than the amount of the spacer material consumed on the PFET device, as depicted in FIG. 1D. Note that enough of the spacer material on the PFET device 10P has been consumed such that portions of the side surfaces of the gate electrode 14B have been exposed, in the regions indicated by the arrow 30.

A device having the structure depicted in FIG. 1D can be problematic for several reasons. First, the excessive pull-down of the spacers on the PFET device 10P, as reflected by the spacers 18X, can lead to decreased device performance and increased processing instability as the amount of such excessive pull-down may vary from wafer to wafer. The excessive pull-down of the spacer material on the PFET device 10P may result in undesirable dopants being implanted into the channel region of the PFET device 10P due to the exposed sidewalls of the gate electrode 14B, e.g., dopants used for so-called halo implants may be unintentionally implanted into the channel region of the PFET device 10P. Another problem may occur when forming metal silicide regions on the gate electrodes 14B. Ideally, the metal silicide region on the gate electrodes will only be formed on the top surface of the gate electrodes 14B. Thus, the gate electrode 14B for the NFET device 10N reflects the ideal condition for beginning the silicidation process, i.e., only the upper surface of the gate electrode is exposed. In contrast, due to the excessive consumption of the spacer material for the PFET device 10P, and the resulting exposure of the sidewalls of the gate electrode 14B for the PFET device 10P, the metal silicide material will form on the top of the gate electrode and, at least to some extent, on the exposed sidewalls of the gate electrode for the PFET device 10P. Creating such a relative large region of silicide material in a region where it is not expected to be may lead to reduced device performance and/or complete failure due to electrical shorts.

The present disclosure is directed to various novel methods of removing gate cap layers in integrated circuit products that employ CMOS technology that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of removing gate cap layers in integrated circuit products that employ CMOS technology. One illustrative method disclosed herein includes the steps of forming a masking layer that covers a P-type transistor and exposes at least a gate cap layer of an N-type transistor, performing a first etching process through the masking layer to remove a portion of the gate cap of the N-type transistor so as to thereby define a reduced thickness gate cap layer for the N-type transistor, removing the masking layer, and performing a common second etching process on the P-type transistor and the N-type transistor that removes a gate cap layer of the P-type transistor and the reduced thickness gate cap of the N-type transistor.

Another illustrative method disclosed herein includes forming a P-type transistor and an N-type transistor, wherein each of the transistors has a gate cap layer and wherein the gate cap layer of the P-type transistor has a thickness that is less than a thickness of the gate cap layer of the N-type transistor, forming a masking layer that covers the P-type transistor and exposes at least the gate cap layer of the N-type transistor, performing a first etching process through the masking layer to remove a portion of the gate cap layer of the N-type transistor so as to thereby define a reduced thickness gate cap layer for the N-type transistor, removing the masking layer, and performing a common second etching process on the P-type transistor and the N-type transistor that removes the gate cap layer of the P-type transistor and the reduced thickness gate cap layer of the N-type transistor.

Yet another illustrative method disclosed herein includes forming a PFET transistor and an NFET transistor, wherein each of the transistors has a gate cap layer of approximately the same initial thickness, forming a first masking layer that covers the NFET transistor while exposing the PFET transistor, with the first masking layer in place, performing at least one first etching process operation on the PFET transistor that reduces a thickness of the gate cap layer of the PFET transistor and thereby defines a reduced thickness gate cap layer for the PFET transistor, removing the first masking layer, forming a second masking layer that covers the PFET transistor and exposes at least the gate cap layer of the NFET transistor, performing a second etching process through the second masking layer to remove a portion of the gate cap layer of the NFET transistor so as to thereby define a reduced thickness gate cap layer for the NFET transistor, removing the second masking layer, and performing a common third etching process on the PFET transistor and the NFET transistor that removes the reduced thickness gate cap layer of the PFET transistor and the reduced thickness gate cap layer of the NFET transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of removing gate cap layers in integrated circuit products that employ CMOS technology. Such novel process flows may tend to reduce manufacturing costs and processing complexity and may tend to at least reduce some of the problems associated with the illustrative prior art process flow described previously. As will be readily apparent to those skilled in the art upon a complete reading of the present application, the novel methods disclosed herein may be employed in a variety of devices that employ CMOS-based technology, including, but not limited to, logic devices, memory devices, etc. With reference to FIGS. 2A-2F, various illustrative embodiments of the novel methods and devices disclosed herein will now be described in more detail.

Figure 2A:
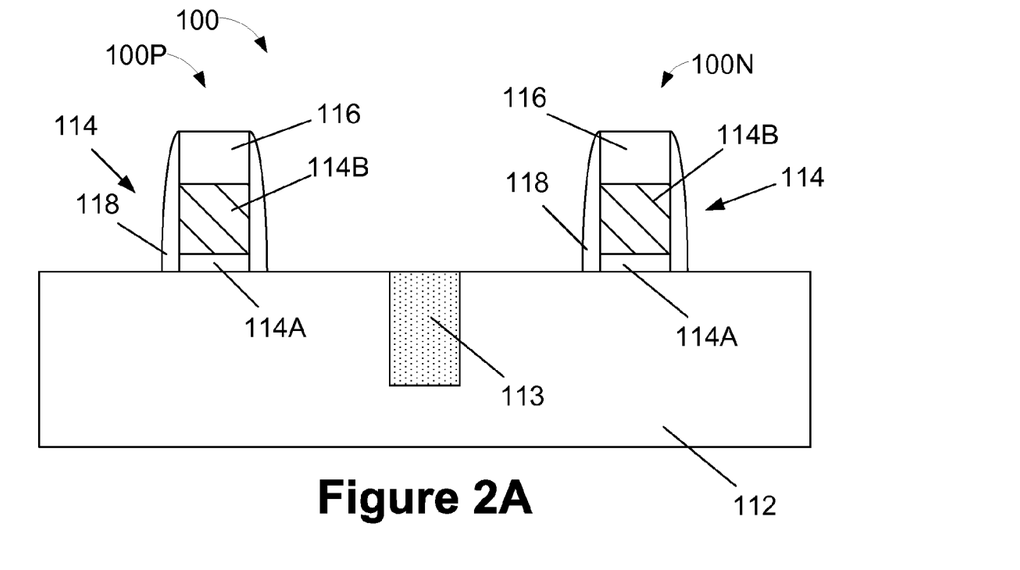
FIGS. 2A-2F depict various examples of the novel methods disclosed herein for removing gate cap layers in integrated circuit products that employ CMOS technology.

FIG. 2A is a simplified view of an illustrative integrated circuit product or device 100 at an early stage of manufacture. The device 100 includes an illustrative PFET transistor 100P and an illustrative NFET transistor 100N that are formed in and above an illustrative semiconductor substrate 112. The substrate 112 may have a variety of configurations, such as the depicted bulk silicon configuration. The substrate 112 may also have a silicon-on-insulator (SOI) configuration that includes a bulk silicon layer, a buried insulation layer and an active layer, wherein semiconductor devices are formed in and above the active layer. The substrate 112 may also be made of materials other than silicon. Thus, the terms "substrate" or "semiconductor substrate" should be understood to cover all forms of semiconductor structures and all semiconductor materials. Various well-known process operations that are performed to implant various dopant materials for the source/drain regions of the devices 100P, 100N, such as masking and ion implantation processes, will not be depicted or described as they are not particularly germane to the novel methods disclosed herein.

FIG. 2A depicts the device 100 at a point of fabrication that corresponds approximately to that shown in FIG. 1A. That is, illustrative gate structures 114 for the PFET transistor 100P and the NFET transistor 100N have been formed in and above regions of the substrate 112 that are separated by an illustrative shallow trench isolation structure 113. The gate structures 114 generally include an illustrative gate insulation layer 114A and one or more conductive gate electrode layers 114B. A gate cap layer 116 made of a material such as silicon nitride is positioned above each of the gate structures 114. Also depicted in FIG. 2A are illustrative sidewall spacers 118 made of a material such as silicon nitride.

The gate structures 114 depicted herein are intended to be schematic and representative in nature, as the materials of construction used in the gate structures 114 may be different for the PFET transistor 100P as compared to the NFET transistor 100N, e.g., the PFET transistor 100P may have multiple layers of conductive metal, etc. The gate insulation layer 114A may be comprised of a variety of materials, such as silicon dioxide, silicon oxynitride, a high-k (k value greater than 7) insulating material, etc. The gate electrode layer 114B may be comprised of one or more layers of conductive materials, such as polysilicon, amorphous silicon, a metal, etc. The structure depicted in FIG. 2A may be formed by performing a variety of known techniques. For example, the layers of material that make up the gate insulation layer 114A, the gate electrode layer 114B and the gate cap layer 116 may be blanket-deposited above the substrate 112 and, thereafter, one or more etching process are performed through a patterned mask layer (not shown) to define the basic gate structures 114 and gate cap layers 116 depicted in FIG. 2A. The spacers 118 may be formed by performing a conformal deposition process to deposit a layer of spacer material across the device and thereafter performing an anisotropic etching process. In general, the spacer 118 and the gate cap layer 116 act to protect the gate structures 114 of the devices 100P, 100N as processing operations continue. Importantly, at this point in the process flow, the gate cap layers 116 on both the PFET device 100P and the NFET device 100N have the same approximate thickness, e.g., about 40-50 nm, depending upon the particular application.

Figure 2B:
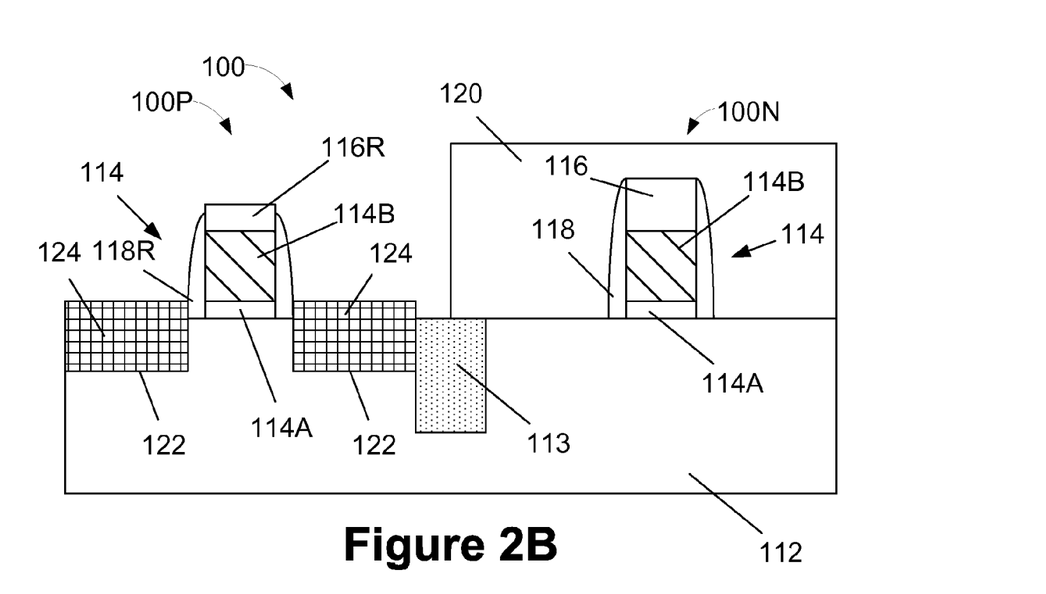

FIG. 2B depicts the device 100 after several process operations have been performed. At the point of fabrication depicted in FIG. 2B, one or more ion implantation processes would have been performed on the NFET transistor 100N to form various doped regions (not shown) in the substrate 112. Next, a schematically depicted masking layer 120, such as a photoresist mask or a hard mask material (like silicon nitride), is formed so as to cover the NFET transistor 100N and expose the PFET transistor 100P for further processing. Then, one or more etching processes were performed to define cavities 122 in areas of the substrate 112 where source/drain regions for the PFET transistor 100P will ultimately be formed. The depth and shape of the cavities 122 may vary depending upon the particular application. In one example, the cavities 122 may be formed by performing an initial dry anisotropic etching process and, thereafter, performing a wet etching process. FIG. 2B depicts the device 100 after an epitaxial deposition process is performed to form epitaxial silicon/germanium (SiGe) regions 124 in the cavities 122. In the depicted example, the SiGe regions 124 have an overfill portion that extends above the surface of the substrate 112. The SiGe regions 124 may be formed by performing well-known epitaxial deposition processes.

Importantly, at the point of fabrication depicted in FIG. 2B, during the process of forming the cavities 122 and the SiGe regions 124, some of the gate cap layer 116 and the spacers 118 on the PFET device 100P are consumed. The consumption of these structures is reflected by the use of the designation 116R for the reduced thickness gate cap layer and the designation 118R for the recessed spacers on the PFET device 100P. The amount of consumption of the original gate cap layer 116 on the PFET device 100P may vary depending upon the particular application and the precise process flow. In some cases, the reduced thickness gate cap layer 116R may be approximately one-half of the thickness of the original gate cap layer 116. The recessed spacers 118R have also been reduced in thickness and overall height during these process operations, i.e., note the pull-down of the spacers 118R relative to the upper surface of the recessed gate cap layer 116R.

Figure 2C:
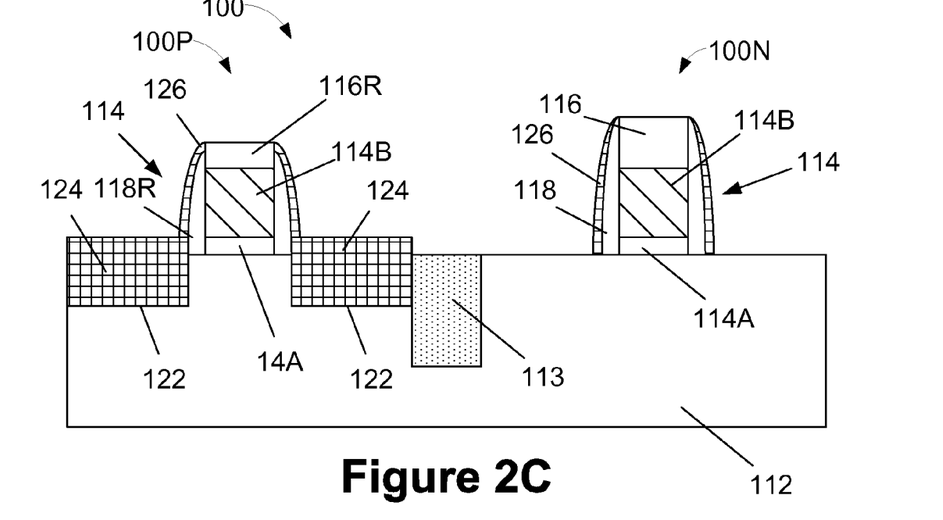

FIG. 2C depicts the device 100 after several process operations have been performed. First, the masking layer 120 was removed. Thereafter, sacrificial sidewall spacers 126 were formed adjacent the spacers 118R, 118. The sacrificial sidewall spacers 126 may be formed by depositing a layer of spacer material, e.g., silicon dioxide, and thereafter performing an anisotropic etching process. Eventually, the gate cap layers 116R, 116 will be removed to expose the gate electrodes 114B so that a metal silicide region may be formed on the gate electrodes 114B. The purpose of the sacrificial sidewall spacers 126 is to protect the relatively thin sidewall spacers 118R, 118 during the gate cap removal process, since the sidewall spacers 118R, 118 are typically made of the same material as that of the gate cap layers 116R, 116, e.g., silicon nitride.

Figure 2D:
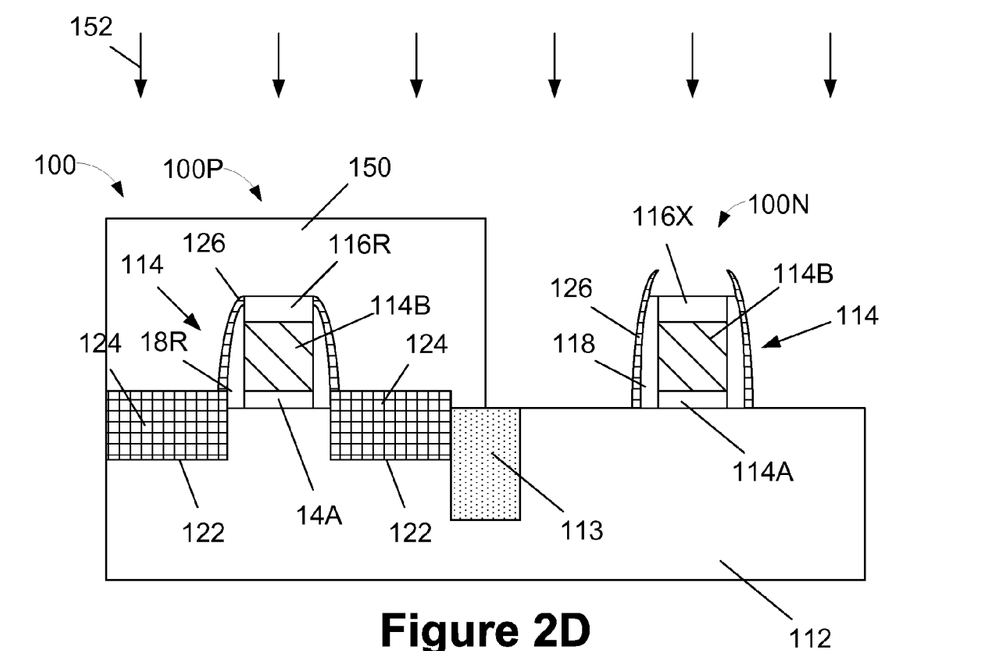

FIG. 2D depicts the device 10 after several process operations have been performed. First, a schematically depicted masking layer 150, such as a photoresist mask or a hard mask material, is formed so as to cover the PFET transistor 100P and expose the NFET transistor 100N for further processing. Then, a partial gate cap etching process 152 was performed on the exposed NFET device 100N to remove or consume a portion of the original thickness of the initial gate cap layer 116 of the NFET device 100N. During this partial gate cap etching process 152, the sacrificial sidewall spacers 126 on the NFET device 100N protect the exterior of the sidewall spacers 118. The consumption of a portion of the initial gate cap layer during the partial gate cap etching process 152 is reflected by the use of the designation 116X for the now reduced thickness gate cap layer on the NFET device 100N. The spacers 118 on the NFET device 100N are also subject to some attack during the partial gate cap etching process 152, as reflected in FIG. 2D. The amount of the initial gate cap layer 116 consumed during the partial gate cap etching process 152 may vary depending upon the particular application. In one illustrative embodiment, the partial gate cap etching process 152 may be performed for such a duration that the thickness of the reduced thickness gate cap layer 116X on the NFET device 100N is approximately equal to the thickness of the reduced thickness gate cap layer 116R on the PFET transistor 100P. In one illustrative embodiment, the partial gate cap etching process 152 may be a timed, reactive ion etching process.

Figure 2E:
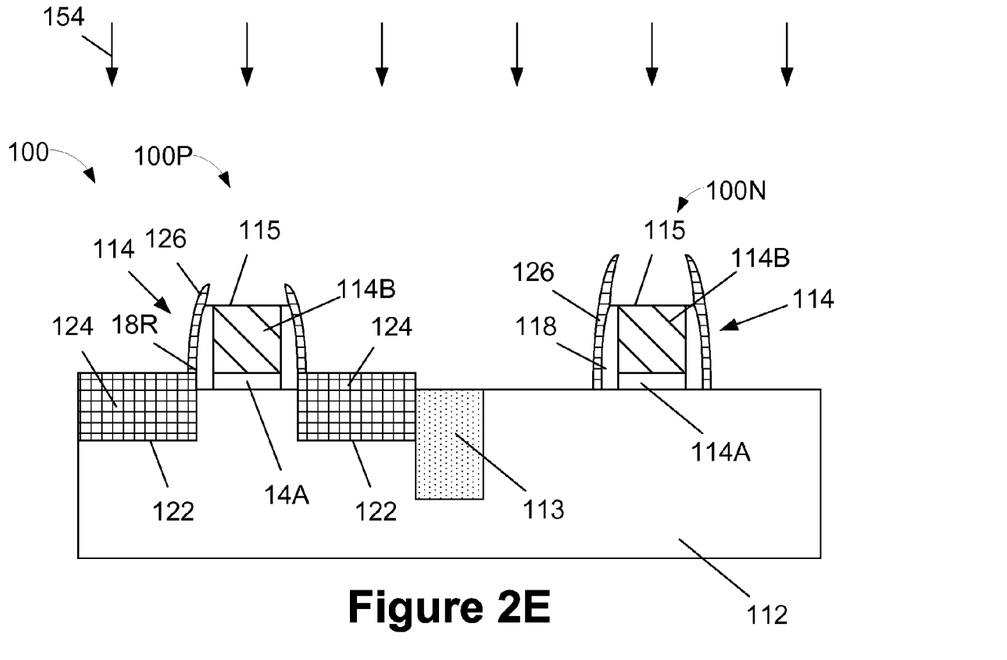

FIG. 2E depicts the device 100 after several process operations have been performed. First, the masking layer 150 was removed. Thereafter, a common gate cap etching process 154 was performed on both of the devices 100P, 100N to remove the reduced thickness gate cap layers 116R, 116X, respectively, and thereby expose the upper surfaces 115 of the underlying gate electrodes 114B for further processing. During this common gate cap etching process 154, the sacrificial sidewall spacers 126 protect the sidewall spacers 118R, 118.

Figure 2F:
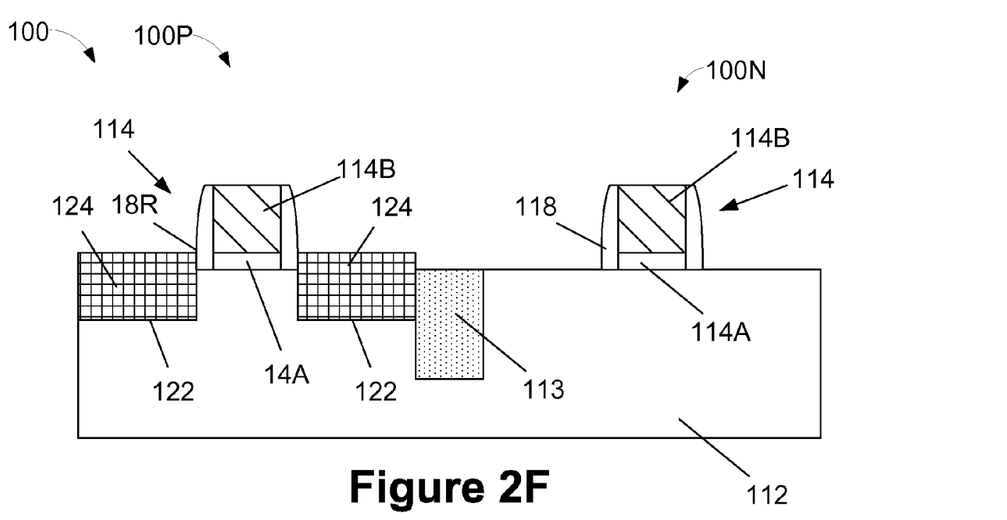

Thereafter, as shown in FIG. 2F, another etching process was performed to remove the sacrificial sidewall spacers 126. At this point in the fabrication process, traditional manufacturing processes may be performed to complete the manufacture of the device 100. For example, metal silicide regions may be formed on the gate electrodes, various conductive contacts, lines and vias may be formed above the devices, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
forming a sacrificial sidewall spacer adjacent to a gate structure of each of a P-type transistor and an N-type transistor, wherein a material of said sacrificial sidewall spacer has an etch selectivity relative to a material of a gate cap layer formed above said gate structure of each of said P-type and N-type transistors;
forming a masking layer that covers said P-type transistor and exposes at least said gate cap layer of said N-type transistor;
performing a first etching process through said masking layer to selectively remove a portion of said gate cap of said N-type transistor relative to said sacrificial sidewall spacer of said N-type transistor so as to thereby define a reduced thickness gate cap layer for said N-type transistor;
removing said masking layer;
performing a common second etching process on said P-type transistor and said N type transistor to selectively remove said gate cap layer of said P-type transistor and the reduced thickness gate cap layer of said N-type transistor relative to said sacrificial sidewall spacer of said respective P-type and N-type transistors.

2. The method of claim 1, wherein said P-type transistor is a PFET transistor and said N-type transistor is an NFET transistor.

3. The method of claim 1, wherein, after performing said first etching process, said reduced thickness gate cap layer of said N-type transistor has a thickness that is approximately equal to a thickness of said gate cap layer of said P-type transistor.

4. The method of claim 1, wherein said material of said gate cap layer of each of said N-type transistor and said P-type transistor is comprised of silicon nitride.

5. The method of claim 1, wherein said masking layer is a patterned photoresist masking layer or a patterned hard mask layer.

6. A method, comprising:
forming a P-type transistor and an N-type transistor, wherein each of said transistors comprises a gate structure and a gate cap layer formed above said gate structure, said gate cap layer of said P-type transistor having a thickness that is less than a thickness of said gate cap layer of said N type transistor;
forming a sacrificial sidewall spacer adjacent to said gate structure and said gate cap layer of said P-type transistor and adjacent to said gate structure and said gate cap layer of said N-type transistor, wherein a material of said sacrificial sidewall spacer has an etch selectivity relative to a material of said gate cap layer of each of said P-type and N-type transistors;
forming a masking layer that covers said P-type transistor and exposes at least said gate cap layer of said N-type transistor;
performing a first etching process through said masking layer to selectively remove a portion of said gate cap layer of said N-type transistor relative to said sidewall sacrificial spacer of said N-type transistor so as to thereby define a reduced thickness gate cap layer for said N-type transistor;
removing said masking layer; and
performing a common second etching process on said P-type transistor and said N type transistor to selectively remove the gate cap layer of said P-type transistor and the reduced thickness gate cap layer of said N-type transistor relative to said sacrificial sidewall spacer of said respective P-type and N-type transistors.

7. The method of claim 6, wherein said gate structure of each of said N-type transistor and said P-type transistor comprise a gate electrode comprised of polysilicon or amorphous silicon.

8. A method, comprising:
forming a PFET transistor and an NFET transistor, wherein each of said transistors comprises a gate structure and a gate cap layer formed above said gate structure, each respective gate cap layer having approximately the same initial thickness;
forming a first masking layer that covers said NFET transistor while exposing said PFET transistor;
with said first masking layer in place, performing at least one first etching process operation on said PFET transistor that reduces a thickness of said gate cap layer of said PFET transistor and thereby defines a reduced thickness gate cap layer for said PFET transistor;
removing said first masking layer;
after removing said first masking layer, forming a sacrificial sidewall spacer adjacent to said gate structure and said reduced thickness gate cap layer of said PFET transistor and adjacent to said gate structure and said gate cap layer of said NFET transistor, wherein a material of said sacrificial sidewall spacer has an etch selectivity relative to a material of said reduced thickness gate cap layer of said PFET transistor and to said gate cap layer of said NFET transistor;
after forming said sacrificial sidewall spacers, forming a second masking layer that covers said PFET transistor and exposes at least said gate cap layer of said NFET transistor;
performing a second etching process through said second masking layer to selectively remove a portion of said gate cap layer of said NFET transistor relative to said sacrificial sidewall spacer of said NFET transistor so as to thereby define a reduced thickness gate cap layer for said NFET transistor;
removing said second masking layer; and
performing a common third etching process on said PFET transistor and said NFET transistor to selectively remove the reduced thickness gate cap layer of said PFET transistor and the reduced thickness gate cap layer of said NFET transistor relative to said sacrificial sidewall spacer of said respective PFET and NFET transistors.

9. The method of claim 8, wherein, after performing said second etching process, said reduced thickness gate cap layer of said NFET transistor has a thickness that is approximately equal to a thickness said reduced thickness gate cap layer of said NFET transistor.

10. The method of claim 8, wherein said gate structure of each of said NFET and PFET transistors comprise a gate electrode comprised of polysilicon or amorphous silicon.

11. The method of claim 1, wherein each of said N-type and P-type transistors comprise a first sidewall spacer positioned adjacent to said gate structure, and wherein said sacrificial spacers are formed to cover said respective first sidewall spacers of said respective N-type and P-type transistors.

12. The method of claim 11, wherein said material of said sacrificial sidewall spacers has an etch selectivity relative to a material of said first sidewall spacers of said respective N-type and P-type transistors.

13. The method of claim 4, wherein said material of said sacrificial sidewall spacer of each of said N-type transistor and said P-type transistor is comprised of silicon dioxide.

14. The method of claim 6, wherein each of said N-type and P-type transistors comprise a first sidewall spacer positioned adjacent to said gate structure, and wherein said sacrificial spacers are formed to cover said respective first sidewall spacers of said respective N-type and P-type transistors.

15. The method of claim 14, wherein said material of said sacrificial sidewall spacers has an etch selectivity relative to a material of said first sidewall spacers of said respective N-type and P-type transistors.

16. The method of claim 6, wherein said P-type transistor is a PFET transistor and said N-type transistor is an NFET transistor.

17. The method of claim 6, wherein, after performing said first etching process, said reduced thickness gate cap layer of said N-type transistor has a thickness that is approximately equal to said thickness of said gate cap layer of said P-type transistor.

18. The method of claim 1, wherein said gate structure of each of said N-type transistor and said P-type transistor comprise a gate electrode comprised of polysilicon or amorphous silicon.

19. The method of claim 8, wherein each of said NFET and PFET transistors comprise a first sidewall spacer positioned adjacent to said gate structure, and wherein said sacrificial spacers are formed to cover said first sidewall spacer of said respective NFET and PFET transistors.

20. The method of claim 19, wherein said material of said sacrificial sidewall spacers has an etch selectivity relative to a material of said first sidewall spacers of said respective NFET and PFET transistors.

\* \* \* \* \*